United States Patent
De et al.

(10) Patent No.: US 10,498,351 B1
(45) Date of Patent: Dec. 3, 2019

(54) HIGH-SPEED DAC

(71) Applicant: Invecas, Inc., Santa Clara, CA (US)

(72) Inventors: Koushik De, Hyderabad (IN); Pramod Kumar Chennoju, Warangal Urban (IN)

(73) Assignee: Invecas, Inc., Santa Clara, CA (US)

( * ) Notice: Subject to any disclaimer, the term of this patent is extended or adjusted under 35 U.S.C. 154(b) by 0 days.

(21) Appl. No.: 15/989,081

(22) Filed: May 24, 2018

(51) Int. Cl.
  *H03M 1/76* (2006.01)
  *H03M 1/74* (2006.01)
  *H03M 1/10* (2006.01)

(52) U.S. Cl.
  CPC ......... *H03M 1/765* (2013.01); *H03M 1/1061* (2013.01); *H03M 1/747* (2013.01)

(58) Field of Classification Search
  CPC ..... H03M 1/765; H03M 1/1061; H03M 1/747
  USPC ........................................................ 341/144
  See application file for complete search history.

(56) References Cited

U.S. PATENT DOCUMENTS

| | | | | |
|---|---|---|---|---|
| 8,081,099 B2* | 12/2011 | Ikoma | ............... | H03M 1/0604 |
| | | | | 327/382 |
| 8,179,295 B2* | 5/2012 | Ho | ................. | H03M 1/1057 |
| | | | | 341/136 |
| 8,928,512 B2* | 1/2015 | Yuan | ............... | H03M 1/685 |
| | | | | 341/136 |
| 9,136,864 B1 | 9/2015 | Teterwak et al. | | |
| 9,800,259 B1* | 10/2017 | Chou | ............... | H03M 1/745 |
| 2015/0244390 A1 | 8/2015 | Teterwak et al. | | |

OTHER PUBLICATIONS

Tarek H. Zaki, A Compact 12-bit Current-Steering D/A Converter for HDRC Camera Systems, Jan. 15-Apr. 15, 2010, p. 1-p. 80, Institut fur Mikroelektronik Stuttgart (IMS CHIPS), Germany.
Xu et al, A 14-bit-500 MS/s DAC with digital background calibration, Journal of Semiconductors, Mar. 2014, p. 035008-1-p. 035008-6, vol. 35, No. 3., Chinese Institute of Electronics, China.
Wang et al, A 400-MS/s 12-bit current-steering D/A converter, Journal of Semiconductors, Aug. 2012, p. 085006-1-p. 085006-5, vol. 33, No. 8, Institute of Microelectronics, Tsinghua University, Beijing, China.

* cited by examiner

*Primary Examiner* — Brian K Young
(74) *Attorney, Agent, or Firm* — Venture Pacific Law, PC (57) ABSTRACT

A digital-to-analog converter ("DAC") system for converting a digital input code to an analog signal, comprises: an N-bit DAC and a back-gate bias generator ("BBGEN"). The N-bit DAC has a reference cell and a current source array of unit cells for generating a DAC output. The ("BBGEN") generates a first back-gate bias voltage PB_CSM and a second back-gate bias voltage PB_CSA. A back gate of the reference cell is configured to receive the first back-gate bias voltage PB_CSM. A back gate of each of the unit cells is configured to receive the second back-gate bias voltage PB_CSA. The reference cell is configured to generate a main current, and the unit cells are configured to mirror the main current.

18 Claims, 7 Drawing Sheets

HIGH-SPEED DAC

FIELD OF INVENTION

The disclosure generally relates to a digital to analog converter ("DAC"), and more particularly to a high-speed DAC using back-gate biasing.

BACKGROUND

Data converters are integral part of various system-on-chip ("SoC") applications that have precision and speed requirements. A shift to high performance data converters is unavoidable in modern semiconductor fabrication technologies. However, process corner variations in data converters can degrade performance and speed of the data converters; especially due to scaling of nodes, the impact has become even more severe.

To achieve desired performance in terms of resolution, speed of operation, system linearity, and noise margins, SoC designers use a variety of calibration methods for the DAC. Although such calibration methods can provide alignment for the DAC, calibration in a production tester for every component of the DAC can add extra unwanted costs and increase time to market for the DAC.

For instance, U.S. Pat. No. 9,136,864 discloses a DAC that uses current cells that are connected to current trimming modules. The DAC has a plurality of segments and current drivers which are operated at different trim coefficients driven by an external or internal source to adjust the threshold voltage for each segment. To achieve different well biasing, each of the segments need to be placed in different isolated deep N-well. Isolation of the deep N-well islands require more area overhead for the DAC. Though this technique helps to tune a threshold voltage of individual segments, it suffers from mismatches among the segments. Local mismatches are difficult to tune due to limitations for granular control of the back-gate bias voltage of different segments.

To reduce error due to individual cell mismatch, DAC designers may implement regular patterns, such as a double or triple centroid layout for the DAC. Also, different switching schemes have been used and adopted to reduce the internal mismatch of the most significant cells of the DAC. For a higher resolution application, a calibration logic can be used where most significant bit ("MSB") segments each require separate calibration by adding or subtracting the required amount of current for each of the MSB segments to align them. However, such calibration demands extra chip area and power. Even after maintaining proper layout and design precautions, it would be difficult to reduce these errors to a lower extent suitable for high resolution data converters.

Therefore, it is desirable to provide improved new methods, systems, and circuits for a high-speed DAC. Furthermore, it is desirable to provide for trimming and finer adjustment for the high-speed DAC by providing a control knob(s) for back-gate bias control.

DESCRIPTION OF THE DRAWINGS

The foregoing and other aspects of the disclosure can be better understood from the following detailed description of the embodiments when taken in conjunction with the accompanying drawings.

DETAILED DESCRIPTION OF THE EMBODIMENTS

Certain aspects and embodiments of this disclosure are provided below. Some of these aspects and embodiments may be applied independently and some of them may be applied in combination as would be apparent to those of skill in the art. In the following description, for the purposes of explanation, specific details are set forth in order to provide a thorough understanding of embodiments of the invention. However, it will be apparent that various embodiments may be practiced without these specific details. The figures and description are not intended to be restrictive.

The ensuing description provides exemplary embodiments only, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the invention as set forth in the claims section.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but it may have additional steps not included in the present disclosure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to, portable or non-portable storage devices, optical storage devices, and various other mediums capable of storing, containing, or carrying instruction(s) and/or data. A computer-readable medium may include a non-transitory medium in which data can be stored and that does not include carrier waves and/or transitory electronic signals propagating wirelessly or over wired connections. Examples of a non-transitory medium may include, but are not limited to, a magnetic disk or tape, optical storage media such as compact disk ("CD") or digital versatile disk ("DVD"), flash memory, memory or memory devices. A computer-readable medium may have stored thereon code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, or the like.

Furthermore, embodiments may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a computer-readable or machine-readable medium. A processor(s) may perform the necessary tasks.

In a first observation, gain error is an important specification for a DAC. Salient reasons for gain error include offset due to process skew of an internal bias generator and mismatch between a main current source and mirrored current steering unit cells. All of these factors result in a large gain error for the DAC, which greatly impact the voltage output of the DAC. By adjusting a back-gate bias voltage of either a reference current source or mirrored current branches, the gain error curve can be adjusted and aligned to a desired curve for compensating of such gain error.

In a second observation, a minimum supply voltage requirement for the DAC is large for the following reasons: to maintain sufficient headroom for all devices in a wide swing current mirror stack, to obtain a large signal swing at the output of the DAC, and to reduce the power of the current steering unit cells of the DAC. The minimum voltage supply requirement can be relaxed by adjusting a threshold voltage of the devices of the DAC used as current source unit cells. By adding back-gate bias terminals for a reference current cell for current generation and mirror branches (e.g., current source unit cells), a minimum voltage supply can be achieved without compromising accuracy and speed of operation.

In a third observation, dynamic performance for a spurious-free dynamic range ("SFDR") depends on output impedance of current steering for the DAC. Using proper back-gate biasing one can achieve a dynamic range for the converter for low power.

In view of the observations, a DAC of the present disclosure can contain a reference current cell and unit cells having back-gate biasing. A back-gate bias generator can be used to trim a threshold voltage difference between a reference current cell and a current source array of unit cells without having to change physical dimensions of the unit cells nor without additional current source legs for trimming of each of the unit cells. Design performance at a lower power supply is optimized by utilizing back-gate bias control knob(s). Efficient adaptive control of the DAC system can be provided by using a programmable back-gate bias generator in a SoC design perspective. As such, the DAC system performance can be aligned to match its ideal behavior and adjust power from the DAC system dynamically by adjusting the back-gate bias voltages for the reference current cell and for the current source array, independently or collectively.

A DAC system of the present disclosure can also use adaptive back-gate bias control on a fully depleted silicon-on-insulator ("FDSOI") technology node, where power and performance optimization can be performed during production testing phase or design bring up phase. The adaptive back-gate biasing scheme can compensate for any intrinsic non-linearity of the current steering DAC due to impacts with process and mismatch within symmetrical unit elements. The proposal of utilizing dynamic power scaling without compromising performance with back-gate bias control of current steering DAC can be demonstrated in silicon. It is important to note low noise levels at a back-gate node of a DAC of the present disclosure to avoid signal contamination through noise coupling at the DAC output.

An autocalibration method can be used at a booting phase of the DAC for alignment to gain higher performance and for mitigating a need for a standalone calibration cycle. Thereby, reduced cost and turnaround time to market can be gained.

Additionally, calibration on the fly during power up and initial settling phase of the DAC system can be convenient and more easily performed as there may not be a need to operate the device in a separate calibration mode. The process can involve an internal adaptive control loop to work with external predefined fixed reference parameters to tune internal design parameters closer to a center value. The loop can automatically adjust a device's operating point and align the DAC to produce a desired performance specification. In this case, predefined device parameters can be observed.

Another method can be to adjust device parameters, such as threshold voltage Vth, and align device performance closer to typical corners. Adjustment of the threshold voltage can be conveniently accomplished by changing a bulk voltage. However, it can be a risky operation in conventional planner technology which could result in more junction leakage and possess a threat of high bulk current during certain transient surges. The FDSOI process technology encourages utilization of bulk terminal voltage tuning. For instance, FDSOI technology with a buried oxide layer ("BOX") can isolate the substrate and an active device for more accurate control of the threshold voltage. FDSOI circuit can employ back-gate biasing to adaptively trim and align the block to achieve a desired performance. For data converters, FDSOI back-gate bias can also be utilized.

As an application for back-gate bias adaptive trimming, while implementing high speed and high-resolution DACs, a current steering type is a convenient choice with static and dynamic errors due to mismatch and corner variations. The static performance parameters include offset and gain error, integral and differential nonlinearity as a biproduct of mismatch between the individual unit elements, and static output impedance of each of the unit cells. Dynamic linearity can be measured in terms of SFDR and signal-to-noise ratio ("SNR") parameters and can be due to low AC output impedance at a given frequency.

In terms of advantages of such DAC, the DAC can have power savings. A low supply voltage operation mode is enabled without compromising accuracy and speed performance by controlling back-gate bias voltage of a high speed current steering DAC. Furthermore, trimming of linearity performance parameter such as gain error of the high speed and high resolution current steering DAC can be achieved by changing back-gate bias voltage of the unit cells of the DAC. Also, another performance parameter, offset error, can also be corrected by changing back-gate bias voltage of a primary current source of current steering DAC, e.g., a reference current cell for generating a main current. Even more so, dynamic performance such as SFDR can be achieved with reduced supply voltage level by the back-gate bias control.

A current steering DAC power scaling can be achieved by combining back-gate terminals of the main source (i.e., the reference current cell) and unit current amplifier source ("CSA", i.e., the unit cells) together by changing the respective back-gate biases, accordingly. From a SoC perspective, an adaptive back-gate bias control can be designed with software control/microcontroller and a hard macro cell, referred to as a programmable back-gate bias generator ("BBGEN"), where the loop adjusts the back-gate bias output voltage until critical bench marking parameters such as full scale output and/or SFDR fall within a predefined window, e.g., a specification window. Low pass filtering may be required in order to isolate noise at the back-gate bias generator's output before that the output signal is applied to a back-gate bias pin of the current steering current sources of the DAC. Also, gain correction and dynamic power scaling can be done with any data converters and any analog circuit.

Figure 1:
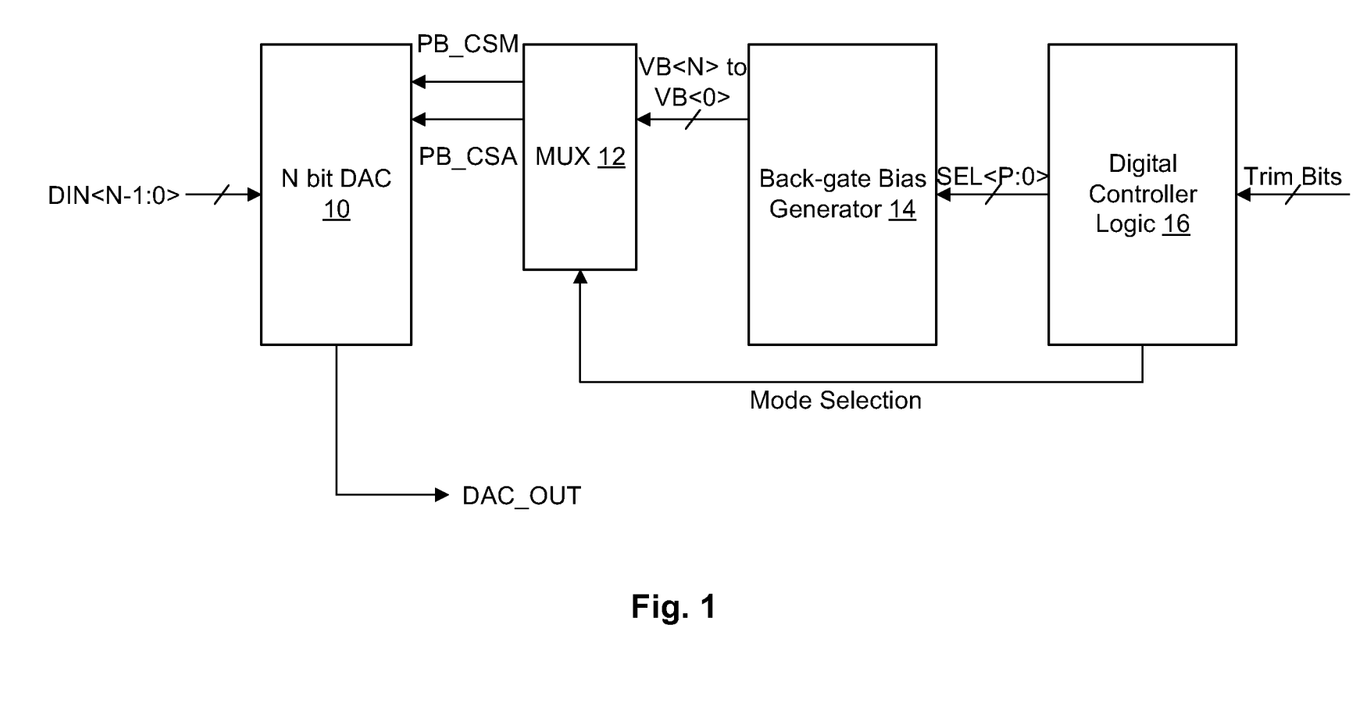
FIG. 1 illustrates a block diagram of a DAC system of the present disclosure.

FIG. 1 illustrates a block diagram of a DAC system of the present disclosure. A DAC system of the present disclosure comprises an N-bit DAC 10, a multiplexer 12, a back-gate bias generator 14, and a digital controller logic 16. The N-bit DAC 10 receives a digital input code DIN having N bits at the DAC 10's input, and then converts the digital input code DIN to an analog signal DAC_OUT for output. The DAC_OUT signal can be a differential signal or single ended signal. The embodiments illustrated hereon are described in relation to generating a differential signal DAC_OUT. However, it's appreciated that the present disclosure can be used to generate a single ended output signal by a DAC of the present disclosure.

A reference current cell of the DAC 10 (not shown here, but illustrated in FIGS. 2 and 3) for generating a main current has a transistor that is back-gate biased by a voltage PB_CSM. A current source array of unit cells of the DAC 10 (not shown here, but illustrated in FIGS. 2 and 4) for mirroring the main current of the reference current cell has transistors that are back-gate biased by a voltage PB_CSA. The back-gate bias voltages PB_CSM and PB_CSA are applied to the DAC to compensate for nonlinearity due to process variations, including offset due to process skew and mismatch between the reference current cell and the unit cells of the main current source array.

The back-gate bias voltages PB_CSM and PB_CSA can be adjusted to have the output DAC_OUT more closely track with a desired value based on a particular inputted digital code. For instance, trim bits can be inputted to the digital controller logic 16 for controlling the back-gate bias generator 14 and the multiplexer 12. The digital controller logic 16 can generate a signal SEL having P bits for setting the back-gate bias generator 14 to generate the various back-gate bias voltages VB<N> to VB<0>. The back-gate bias generator 14 can be implemented by a digital-analog-circuit, which receives a digital input (e.g., a SEL<P:0>) and provides a desired analog voltage output(s) (e.g., VB<N> to VB<0>). The DAC may also have a voltage generator and a selection logic for outputting the desired voltage output(s).

The generated back-gate bias voltages VB<N> to VB<0> are inputted to the multiplexer 12. The mode selection signal from the digital controller logic 16 is inputted to the multiplexer 12 to select one of the generated back-gate bias voltages VB<N> to VB<0> to be the voltage PB_CSM and to select one of the generated back-gate bias voltages VB<N> to VB<0> to be the voltage PB_CSA. The digital controller logic 16 can be implemented by system software or logic hardware and may have multiple modes for selecting back-gate bias voltages for PB_CSM and PB_CSA. The mode selection signal can be generated by the digital controller logic 16 to the multiplexer 12 for selecting the desired back-gate bias voltages for operating in a particular mode.

Operationally, the back-gate bias generator ("BBGEN") 14 generates bias voltage VB<N:0> where, N is number of data converter systems of the BBGEN 14 used in the SoC design for back-gate bias control. Resolution of each bias voltage can be programmable and customized to meet a data converter's specific requirement. A typical range of the BBGEN 14's output can be positive, from 0 to $V_{BBGEN}$, or negative, from 0 to $-V_{BBGEN}$. The digital controller logic 16 sets the BBGEN 14's input bits to a specific value. The output from the BBGEN 14 can change in steps of a few mV (e.g., a typical range could be from 50-100 mV) in order to align threshold voltages of transistor devices or other circuit structures of the DAC 10. A low pass filter may be needed in order to filter out ripples at the BBGEN 14's output before the back-gate bias voltages are used for the N-bit DAC 10. A noise budget at the BBGEN 14's output can be decided by accuracy and/or resolution requirements of the DAC 10.

Figure 2:
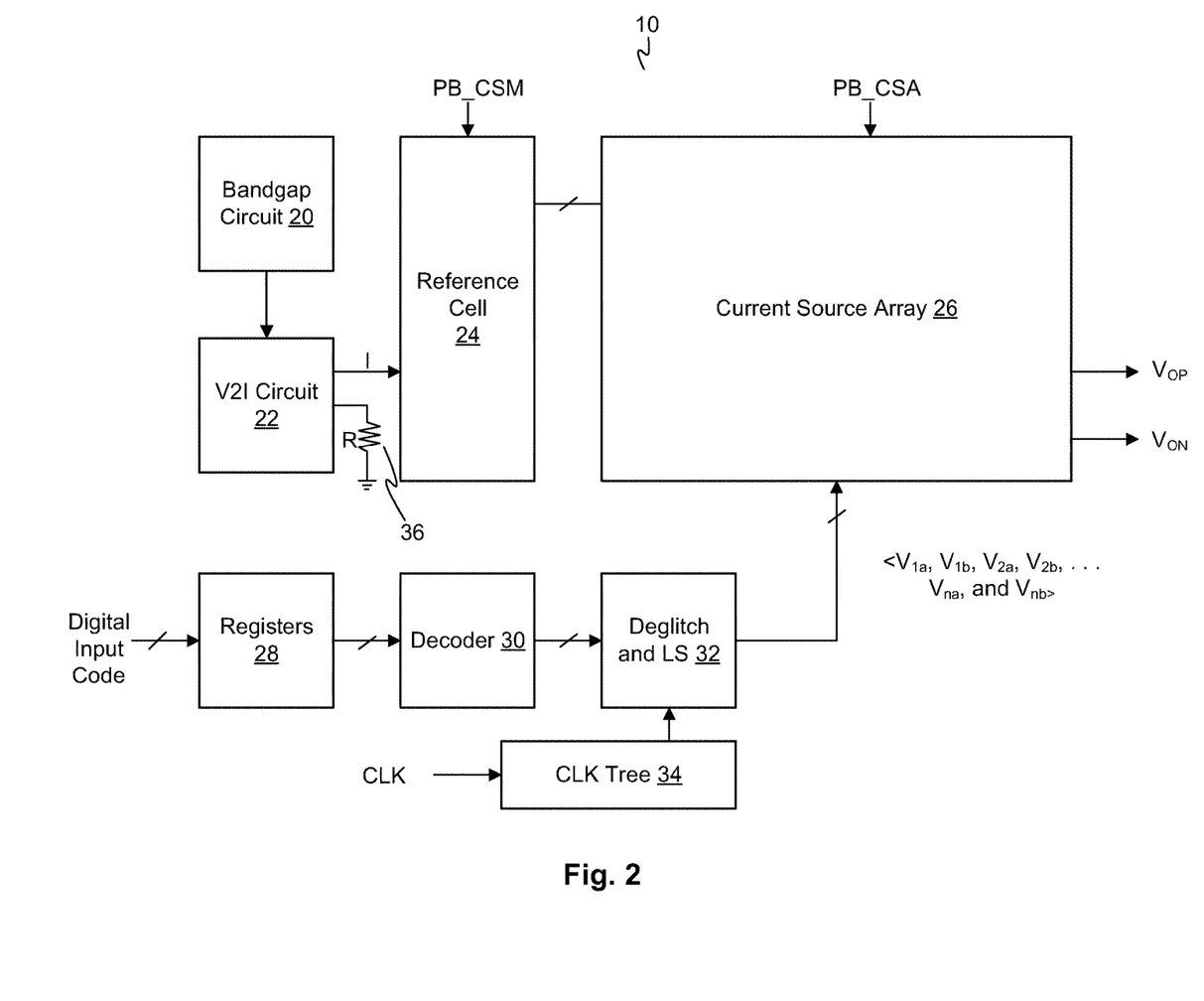
FIG. 2 illustrates a block diagram of an N-bit DAC of the present disclosure.

FIG. 2 illustrates a block diagram of an N-bit DAC of the present disclosure. The N-bit DAC 10 can comprise a bandgap circuit 20, a voltage-to-current ("V2I") circuit 22, a reference current cell 24 to generate a main current, a current source array 26 having unit cells to generate mirrored currents of the main current, registers 28, a decoder 30, a deglitch and level shifter ("LS") 32, and a clock tree 34. The registers 28, the decoder 30, and the deglitch and LS 32 are serially connected to convert the digital input code into differential signals for controlling switches of the unit cells of the current source array 26.

The registers 28 receive and store the digital input code DIN. The digital input code DIN is then decoded by the decoder 30. The deglitch and LS 32 deglitches the decoded input code, and can also convert the voltage range of the deglitched and decoded input code to be applied as gate voltages to transistors in the unit cells of the current source array 26. The clock tree 34 can receive a clock signal CLK and distribute the clock signal CLK to the deglitch and LS 32.

The bandgap circuit 20 generates a band gap voltage $V_{BG}$. The band gap voltage $V_{BG}$ is inputted to the V2I circuit 22 for generating a current I that can be equal to the band gap voltage $V_{BG}$ divided by a resistance R of a resistor 36. It can be appreciated that the resistor 36 can be implemented as part of the DAC 10 or as an external resistor coupled to the DAC 10. The V2I circuit 22 is coupled to the reference current cell 24 so that the current I can be applied to the reference current cell 24 as a current sink.

The reference current cell 24 and the current source array 26 are coupled for generating a differential analog output $V_{OP}$ and $V_{ON}$. The voltage PB_CSM is inputted to the reference current cell 24 for back-gate biasing of a transistor of the reference current cell 24 to compensate for any process variations to generate a desired current and to adjust the threshold voltage of a transistor of the reference current cell 24 for low power operation. The voltage PB_CSA is inputted to the current source array 26 for back-gate biasing of a transistor of each of the unit cells of the current source array 26 to compensate for any process variations to generate a desired current for the respective unit cell and to adjust the threshold voltage of the transistor of the respective unit cell for calibration.

Figure 3:
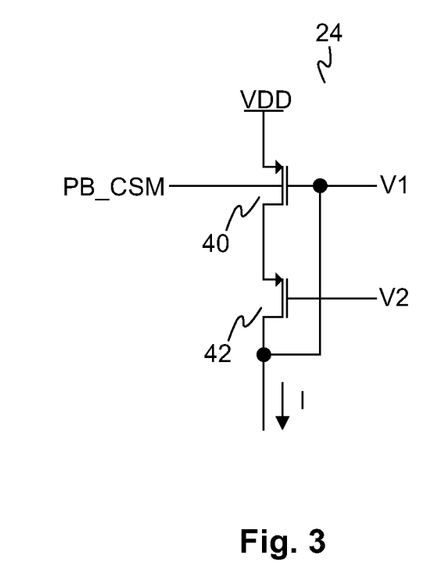
FIG. 3 illustrates a circuit diagram of a reference current cell of an N-bit DAC of the present disclosure.

FIG. 3 illustrates a circuit diagram of a reference current cell of an N-bit DAC of the present disclosure. The reference current cell 24 comprises two serially connected transistors 40 and 42. The transistor 40 has a back-gate biased by the voltage PB_CSM and a gate coupled to the drain of the transistor 42. The drain of the transistor 42 is coupled to the V2I circuit 22, where the voltage at the drain can be denoted V1. The gate of the transistor 40 is also coupled to a corresponding gate of a transistor in each of the unit cells of the current source array 26. A voltage at the gate of the transistor 42 can be denoted V2. The voltage V2 can be generated by a cascode voltage generator (not shown). The gate of the transistor 42 is coupled to a corresponding gate of a transistor in each of the unit cells of the current source array 26. The unit cells of the current source array 26 are coupled to the reference current cell 24 to each mirror the current generated in the reference current cell 24.

Figure 4:
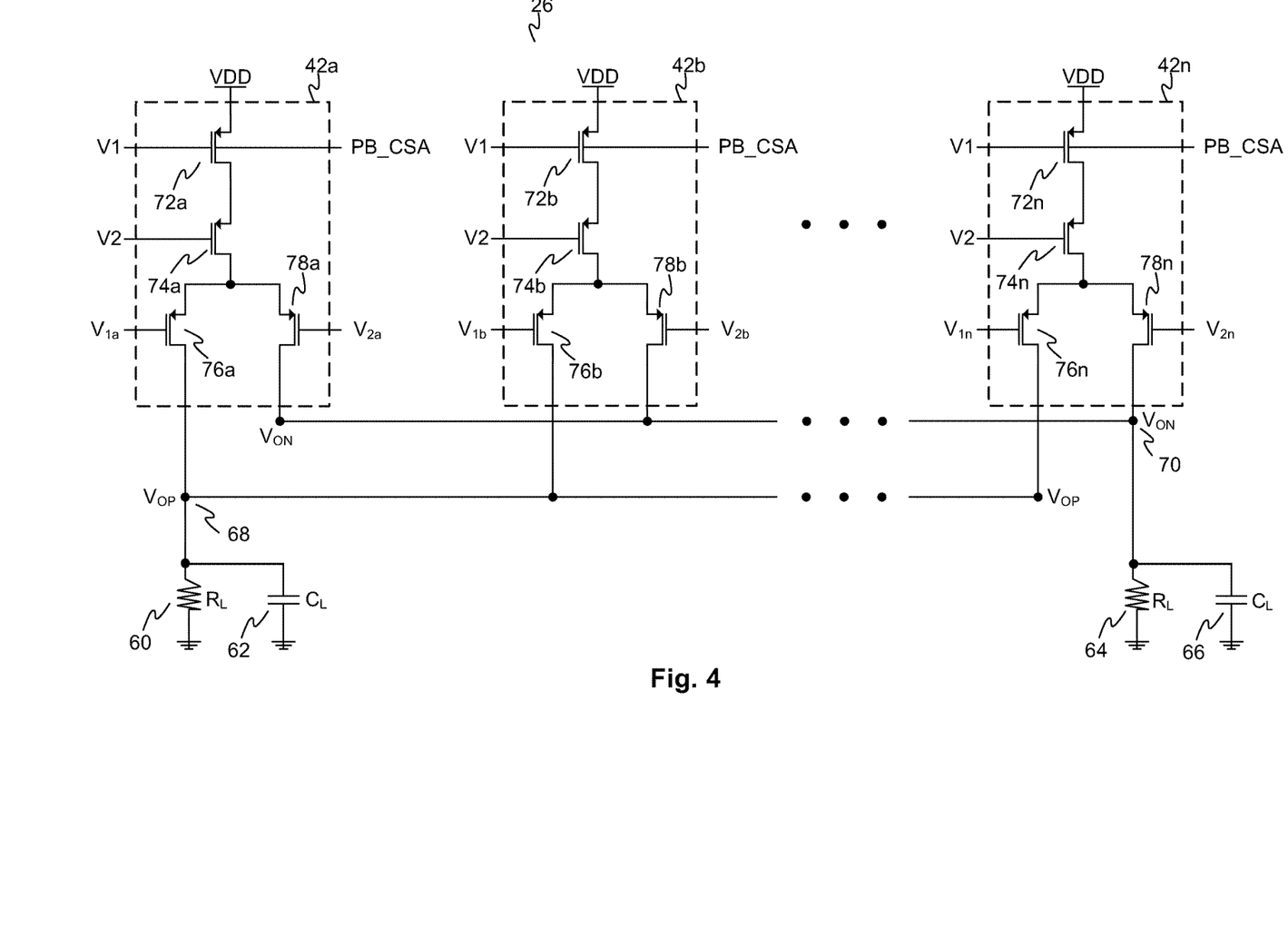
FIG. 4 illustrates a circuit diagram of a current source array of an N-bit DAC of the present disclosure.

FIG. 4 illustrates a circuit diagram of a current source array of an N-bit DAC of the present disclosure. The current source array 26 comprises unit cells 42a-42n, resistors 60 and 64 and capacitors 62 and 66. The number of unit cells 42a-42n can correspond to the bit length of the digital code. The current source array 26 sums the unit cells 42a-42n to generate a differential pair of analog signals $V_{OP}$ and $V_{ON}$. The resistor 60 and the capacitor 62 are coupled to an output node 68 to convert the current from the unit cells 42a-42n to the voltage $V_{OP}$. The resistor 64 and the capacitor 66 are coupled to an output node 70 to convert the current from the unit cells 42a-42n to the voltage $V_{ON}$.

The unit cell 42a comprises transistors 72a-78a. The transistors 72a and 74a are serially connected with one end coupled to a supply voltage VDD and another end coupled to the transistors 76a and 78a. The transistors 76a and 78a are used as switches (and can be simply referred to as a switch) to connect the unit cell 42a to either one of the nodes 68 and 70. For instance, when the transistor 76a is closed, then the current generated by the unit cell 42a is coupled to the node 68. When the transistor 78a is closed, then the current generated by the respective unit cell 42a is coupled to the node 70. The transistors 76a and 78a are controlled by the differential signals V1a-V2a generated by the deglitch and LS 32, such that only one of the transistors 76a and 78a is on at a single time to contribute a current from the unit cell 42a to one of nodes 68 and 70.

The other unit cells 42b-42n can also comprise a structure that has elements that mirror the unit cell 42a. For instance, the unit cell 42b comprises transistors 72b-78b. The transistors 72b and 74b are serially connected with one end coupled to the supply voltage VDD and another end coupled to the transistors 76b and 78b. The transistors 76b and 78b are used as switches to connect the unit cell 42b to the nodes 68 and 70. For instance, when the transistor 76b is closed, then the current generated by the unit cell 42b is coupled to the node 68. When the transistor 78b is closed, then the current generated by the respective unit cell 42b is coupled to the node 70. The transistors 76b and 78b are controlled by the differential signals V1b-V2b generated by the deglitch and LS 32, such that only one of the transistors 76b and 78b is on at a single time to contribute a current to one of nodes 68 and 70 by the unit cell 42b.

Likewise, the unit cell 42n comprises transistors 72n-78n. The transistors 72n and 74n are serially connected with one end coupled to the supply voltage VDD and another end coupled to the transistors 76n and 78n. The transistors 76n and 78n are used as switches to connect the unit cell 42n to the nodes 68 and 70. For instance, when the transistor 76n is closed, then the current generated by the unit cell 42n is coupled to the node 68. When the transistor 78n is closed, then the current generated by the respective unit cell 42n is coupled to the node 70. The transistors 76n and 78n are controlled by the differential signals V1n-V2n generated by the deglitch and LS 32, such that only one of the transistors 76n and 78n is on at a single time to contribute a current to one of nodes 68 and 70 by the unit cell 42n.

The voltage PB_CSA is applied to the back gates of the transistors 72a-72n. The gates of the transistors 72a-72n are coupled to the gate of the transistor 40 of the reference current cell 24; the voltage V1 can be used to denote the voltage at this connection. The gates of the transistors 74a-74n are coupled to the gate of the transistor 42 of the reference current cell 24; the voltage V2 can be used to denote the voltage at this connection.

It can be appreciated that, although the unit cells 42a-42n are illustrated in FIG. 4, any number of unit cells can be used such that the number of unit cells of the current source array can correspond to the number of bits of the digital input code. For the sake of clarity, ellipses, e.g., " . . . " are used to illustrate that other unit cells can be present between the unit cell 42b and 42n and the various electrical connections can run across the other unit cells as well.

The resistor 60 having a resistance $R_L$ and a capacitor 62 having a capacitance $C_L$ are coupled in parallel to the node 68 for generating the voltage $V_{OP}$ using the current flowing to the node 68 from the unit cells 42a-42n. The resistor 64 having the resistance $R_L$ and a capacitor 66 having the capacitance $C_L$ are coupled in parallel to the node 70 for generating the voltage $V_{ON}$ using the current flowing to the node 70 from the unit cells 42a-42n. Thus, the analog, differential signal $V_{ON}$ and $V_{OP}$ can be outputted by the DAC 10 based on the digital input code DIN.

Operationally, the back-gate bias voltages PB_CSM and PB_CSA can be independently controlled or collectively controlled for compensation of various errors to obtain desired functionality by the DAC 10. For instance, in a first mode, the back-gate bias voltage PB_CSM can be held at a constant value and the back-gate bias voltage PB_CSA is adjusted (e.g., from 0V to –2V) for offset compensation and gain correction of the DAC 10. In a second mode for reducing a supply operation of the DAC, both the back-gate bias voltages PB_CSM and PB_CSA are both changed (e.g., from 0V to –2V) in the same direction.

A current steering type architecture is well adopted due to inherent priorities suitable for high speed operations and load termination. The DAC 10 has a master current cell (i.e., the reference current cell 24) and a number of subordinate mirror current sources (i.e., the unit cells 42a-42n) as an array of current steering amplifiers ("CSA"). The weight of each subordinate current mirror cells depends on the DAC's resolution. For example, a 10-bit DAC may have 1024 equally-sized subordinated unit cells uniformly placed and routed over a wider area on a respective die for the DAC. The unit cells can be implemented using P-type metal-oxide-semiconductor ("PMOS")-based current sources. It can be appreciated the reference current cell and the unit cells can be implemented using N-type metal-oxide-semiconductor ("NMOS")-based current sources. For instance, NMOS-based current sinks can be used; hence, the unit elements can act as current sinks. Also, the V2I circuit can be altered to have an internal converter from source to sink. In such embodiment, the voltages used and connections can be altered for such implementation in accordance with the present disclosure. The bulk or back-gate bias voltage(s) for the transistors can be programmable.

Furthermore, two separate back-gate bias pins, one pin for the PB_CSA voltage and another pin for the PB_CSM voltage, can be coupled to the DAC 10 and controlled differently or collectively, depending on the respective mode of application. For instance, to correct gain error, the reference current cell 24 can have its back-gate bias voltage set to a constant voltage, while the subordinate unit cells' back-gate bias voltage can be varied, either positive or negative direction, from the default bias condition.

For a PMOS-based current source, it's advisable to move towards the ground potential (i.e., zero) to −Ve direction. By doing so, the threshold voltages of the subordinate mirror unit cells 42a-42n can be reduced. Also, current through each branch can be adjusted to be aligned overall. It can be noted that for all the unit cells 42a-42n, a common back-gate bias point can be used, where all subordinate current source unit cells 42a-42n can be implemented by an isolated deep N-Well.

Figure 5:
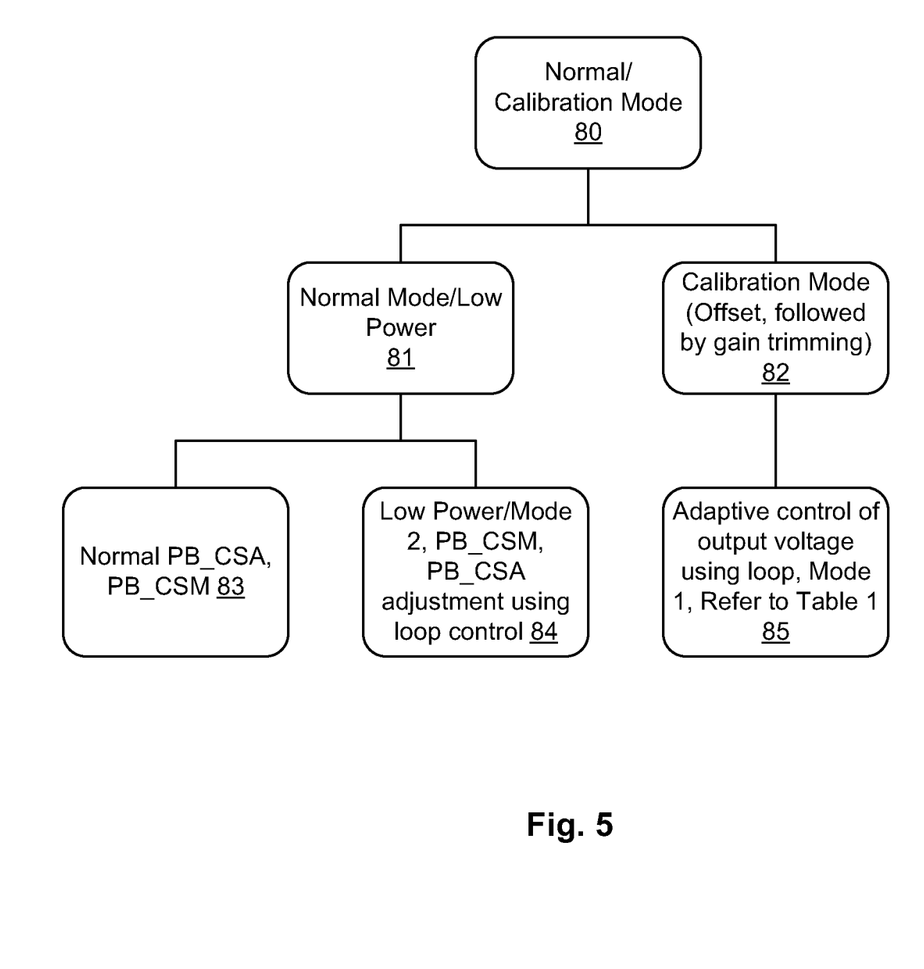
FIG. 5 illustrates a flow chart for operating a DAC of the present disclosure.

FIG. 5 illustrates a flow chart for operating a DAC of the present disclosure. The digital controller 16 can be used to select a particular mode selection for operating the DAC. For instance, during or after a system reset, either a normal mode or a calibration mode can be selected, step 80. For the normal mode, there can be a further selection, step 81, between a normal mode operation or a low power mode operation. If the normal mode operation is further selected, then a normal PB_CSA and PB_CSM selection can be applied, step 83. If a low power normal mode operation is selected, then a Mode 2 (see Table 1 below and relevant sections herein) selection is made using a controller loop, step 84, where the back-gate bias voltages PB_CSM and PB_CSA may be adjusted using loop control.

If the calibration mode is selected, then offset error and gain trimming determination is selected 82. In order to perform such determinations, a Mode 1 (see Table 1 below and relevant sections herein) selection is made, step 85, where adaptive control of the output voltage can be gained using loop control.

Table 1 below provides an example in which back-gate bias voltages PB_CSM and PB_CSA can range from 0V to −2V. However, it is important to note that these voltage ranges are design dependent and may be altered as needed by the design of the respective DAC. Table 1 is not meant to restrict embodiments of the present disclosure to such values.

TABLE 1

Figure 6:
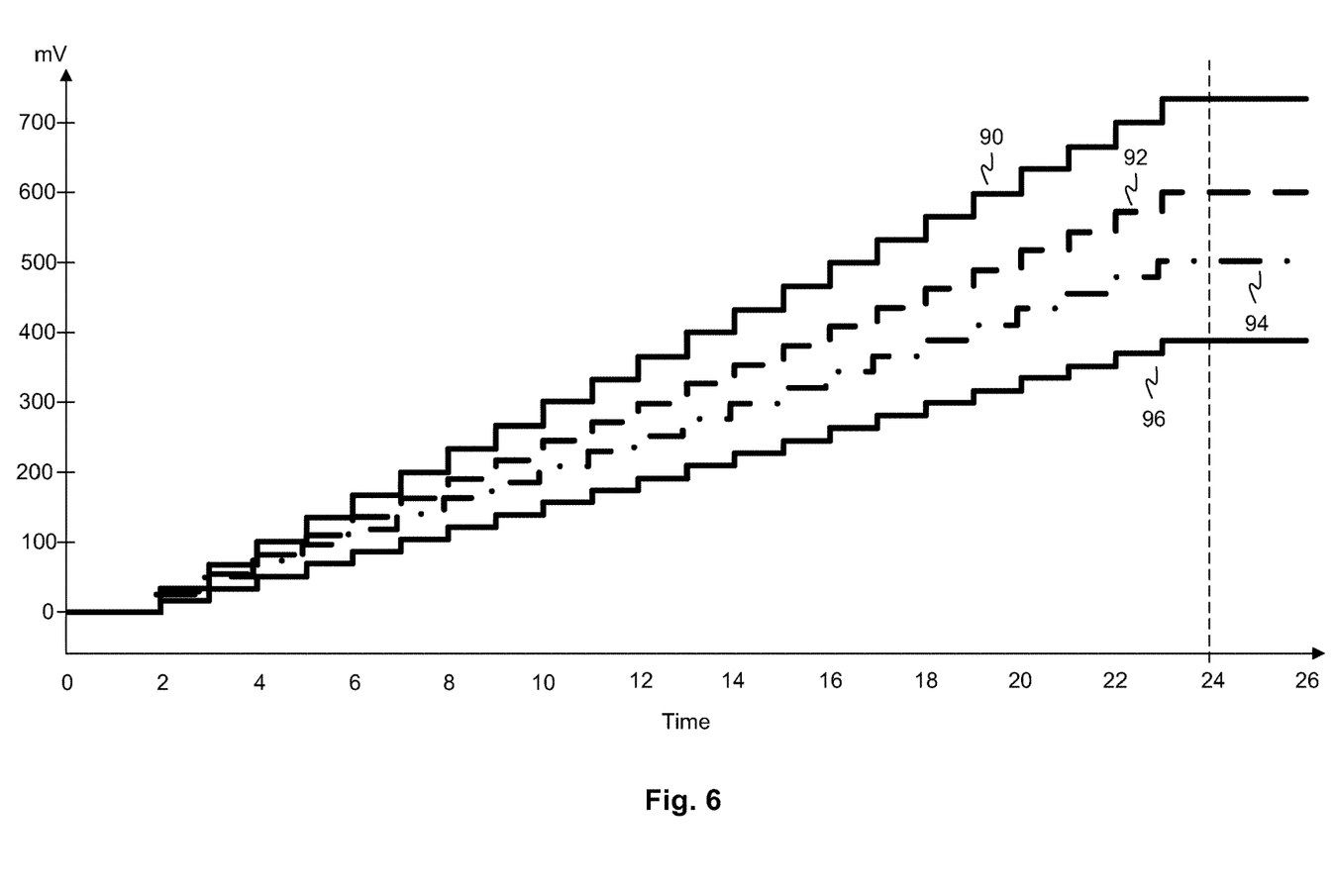
FIG. 6 illustrates a gain error correction graph for a DAC of the present disclosure.
Figure 7:
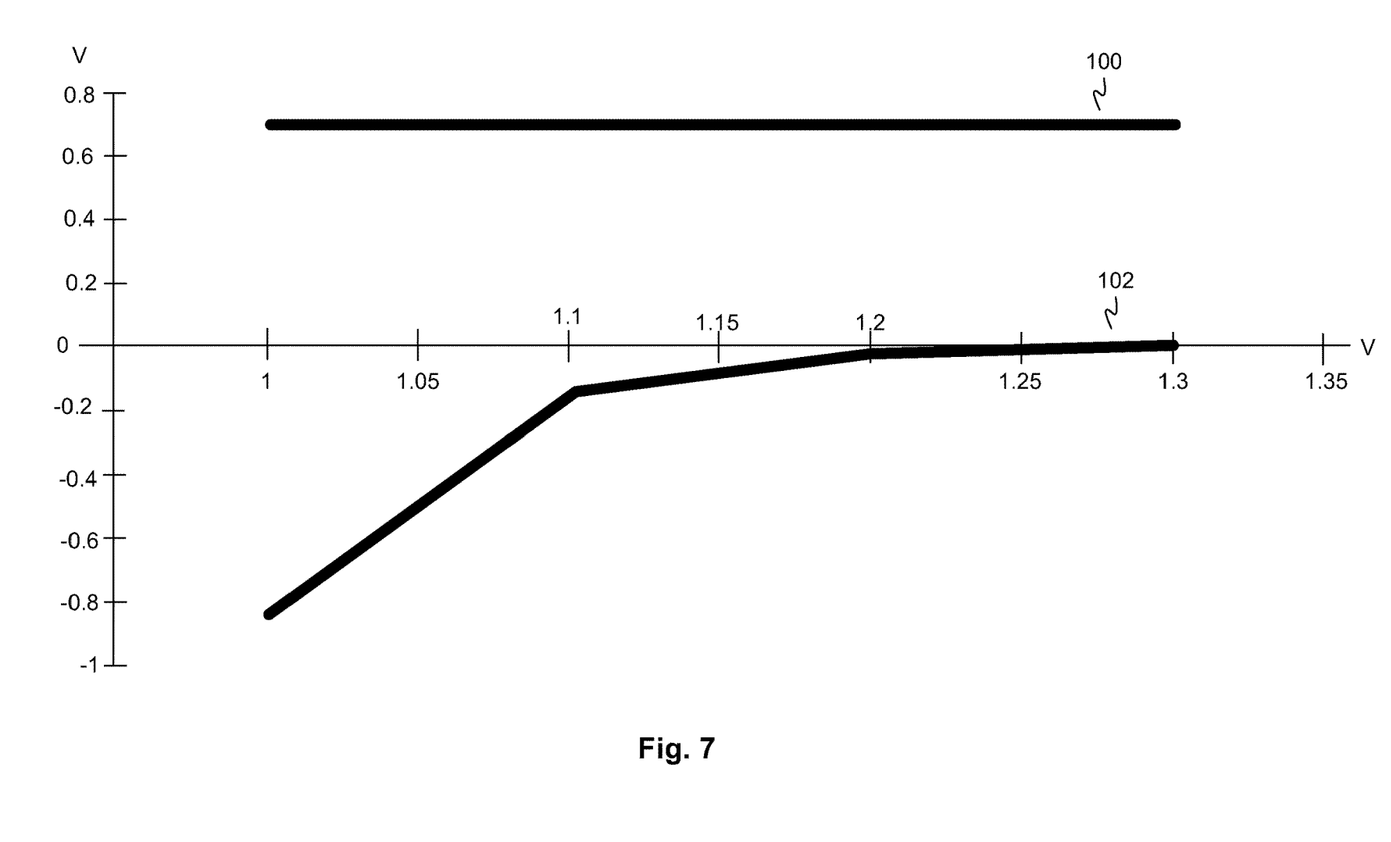
FIG. 7 illustrates a graph for a DAC of the present disclosure showing a power supply reduction and the back-gate bias voltage.

| Mode No. | Terminal for change in Back gate bias (PIN) | Back Gate Bias Voltage (V) | Functionality |
| --- | --- | --- | --- |
| Mode 1 - calibration | A backgate_PIN2 can be used as a combined bias pin for all unit elementary current amplifiers of the DAC | 0 to −2 | Offset/gain error trimming; see Figure 6 for an illustration. |
| Mode 2 - low power operation | A backgate_PIN1 can be used for a main current source cell and a backgate_PIN2 can be used for | 0 to −2 | Supply reduction maintaining same performance; see Figure 7 for an illustration. |

TABLE 1-continued

| Mode No. | Terminal for change in Back gate bias (PIN) | Back Gate Bias Voltage (V) | Functionality |
| --- | --- | --- | --- |
| | combined bias pin for all unit elementary current amplifiers | | |

FIG. 6 illustrates a gain error correction graph for a DAC of the present disclosure. The X-axis is in units of time and the Y-axis is in units of mV. The digital input code can be varied from 0 and to a predefined digital input code in step increments to obtain the graph as shown. After a time equal to 2, the input code is increased every second to a next value to generate an output by the DAC for that input code. A curve 90 corresponds to a DAC output when a back-gate bias voltage PB_CSA is set to −1.22 V; a curve 92 corresponds to a DAC output when a back-gate bias voltage PB_CSA is set to −800 mV; a curve 94 corresponds to a DAC output when a back-gate bias voltage PB_CSA is set to −500 mV; and a curve 96 corresponds to a DAC output when a back-gate bias voltage PB_CSA is set to 0 V.

As illustrated, an output of the DAC can be increased by decreasing the back-gate bias voltage PB_CSA. For instance, at time equal to 24 for a particular digital input code, the output of the DAC is 383.32 mV for the curve 96, the output of the DAC is 512.60 mV for the curve 94, the output of the DAC is 598.18 mV for the curve 92, and the output of the DAC is 735.17 mV for the curve 90.

The various outputs of the DAC for various back-gate bias voltages can be compared with the desired analog voltage level for the particular digital input code and be set accordingly to find the best back-gate bias voltage for obtaining the desired output of the DAC. This process of varying the back-gate bias voltage for a particular digital input code can be performed over a range of digital input codes to obtain a gain error correction plot as well.

The DAC output voltage can range from 0 to about 0.7V as the digital input code increases as time is running. The different plots can result from variation with respect to corner splits of the DAC. The reason of the change in corners can be primarily due to change with the unit current values. In this simulation scenario, to increase the output swing, the back-gate bias voltage has been tuned for the entire current source array together. By changing the back-gate bias in FDSOI technology, the threshold voltage of each element in current source array can be modified, which increases or decreases the current through each cell in the array and consequently change the swing at the output as seen in FIG. 5.

As stated above, gain correction across various corner lots can be achieved by applying a certain back-gate bias voltage to change the swing at the output to more closely reach the ideal output value.

Scaling of the technology node for DACs has resulted in reducing the supply voltage. Therefore, it's necessary for data conversion circuits to work at much lower supply voltages. To reduce minimum required power supply, back-gate bias voltages of nodes for both main and subordinate cells can be changed together.

It can be appreciated that the instant FIG. 6 is applicable for both conditions of independently changing PB_CSM or PB_CSA. Furthermore, PB_CSA and PB_CSM can both be altered together, as well.

FIG. 7 illustrates a graph for a DAC of the present disclosure showing a power supply reduction and the backgate bias voltage. An X-axis is on a voltage scale, where the voltages represent the power supply voltage. A Y-axis is on a voltage scale as well. A curve 100 represents an output voltage and a curve 102 represents a back-gate bias voltage. As can be seen, as the power supply voltage is reduced from 1.3V to 1V (represented by the x-axis), the back-gate bias voltage can be reduced from 0V to greater than −1V to keep the output voltage 100 constant through this fluctuation.

With an amount of reduction in power supply voltage, with respect to back-gate bias voltage movement. The bench marking parameter that were taken as metric are full scale output signal and dynamic parameter such as SFDR. The curve 100 illustrates an unchanged full-scale output value across reduced power supply levels. In total, about 30% reduction in power can be gained by the back-gate bias control of the present disclosure, which can be a major power saving.

In another embodiment, the back-gate bias voltage for PB_CSA and PB_CSM can be set to a predefined voltage, e.g., −1V, and be shifted higher or lower depending on the fluctuation of the output voltage. It can be appreciated that various algorithms can be used to alter the loop control for the back-gate bias voltage to keep the output voltage steady.

Thus, the DAC output can remain at a single voltage value while the supply voltage is reduced. Scaling of the technology node for DACs has resulted in reducing the supply voltage. Therefore, it's necessary for data conversion circuits to work at much lower supply voltages. To reduce minimum required power supply, back-gate bias voltages of nodes for both main and subordinate cells can be changed together.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not taught to be exhaustive or to limit the embodiments to the precise forms disclosed. Many modifications and variations are possible in view of the above teachings.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims. Furthermore, it is appreciated that the terms such as "first", "second", "third", etc. may be used to distinguish between elements such terms describe. These terms are not necessarily intended to indicate temporal or prioritization of such elements, unless otherwise explicitly stated.

As noted, the computer-readable medium may include transient media, such as a wireless broadcast or wired network transmission, or storage media (that is, non-transitory storage media), such as a hard disk, flash drive, compact disc, digital video disc, Blu-ray disc, or other computer-readable media. The computer-readable medium may be understood to include one or more computer-readable media of various forms, in various examples.

In the foregoing description, aspects of the application are described with reference to specific embodiments thereof, but those skilled in the art will recognize that the invention is not limited thereto. Thus, while illustrative embodiments of the application have been described in detail herein, it is to be understood that the inventive concepts may be otherwise variously embodied and employed, and that the appended claims are intended to be construed to include such variations, except as limited by the prior art. Various features and aspects of the above-described invention may be used individually or jointly. Further, embodiments can be utilized in any number of environments and applications beyond those described herein without departing from the broader spirit and scope of the specification. The specification and drawings are, accordingly, to be regarded as illustrative rather than restrictive. For the purposes of illustration, methods were described in a particular order. It should be appreciated that in alternate embodiments, the methods may be performed in a different order than that described.

Where components are described as performing or being "configured to" perform certain operations, such configuration can be accomplished, for example, by designing electronic circuits or other hardware to perform the operation, by programming programmable electronic circuits (e.g., microprocessors, or other suitable electronic circuits) to perform the operation, or any combination thereof.

The various illustrative logical blocks, modules, circuits, and algorithm steps described in connection with the embodiments disclosed herein may be implemented as electronic hardware, computer software, firmware, or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The techniques described herein may also be implemented in electronic hardware, computer software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the methods described above. The computer-readable data storage medium may form part of a computer program product, which may include packaging materials. The computer-readable medium may comprise memory or data storage media, such as random access memory ("RAM") such as synchronous dynamic random access memory ("SDRAM"), read-only memory ("ROM"), non-volatile random access memory ("NVRAM"), electrically erasable programmable read-only memory ("EEPROM"), flash memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagated signals or waves.

The program code may be executed by a processor, which may include one or more processors, such as one or more digital signal processors ("DSPs"), general purpose microprocessors, an application specific integrated circuits ("ASICs"), field programmable logic arrays ("FPGAs"), or other equivalent integrated or discrete logic circuitry. Such a processor may be configured to perform any of the techniques described in this disclosure. A general purpose processor may be a microprocessor; but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Accordingly, the term "processor," as used herein may refer to any of the foregoing structure, any combination of the foregoing structure, or any other structure or apparatus suitable for implementation of the techniques described herein. In addition, in some aspects, the functionality described herein may be provided within dedicated software modules or hardware modules configured for encoding and decoding, or incorporated in a combined encoder-decoder ("CODEC").

Also, configurations may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure. Furthermore, examples of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may perform the described tasks.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of steps may be undertaken before, during, or after the above elements are considered.

We claim:

1. A digital-to-analog converter ("DAC") system for converting a digital input code to an analog signal, comprising:
   an N-bit DAC having a reference cell and a current source array of unit cells for generating a DAC output; and
   a back-gate bias generator ("BBGEN") configured to generate a first back-gate bias voltage PB_CSM and a second back-gate bias voltage PB_CSA;
   wherein a back gate of the reference cell is configured to receive the first back-gate bias voltage PB_CSM,
   wherein a back gate of each of the unit cells is configured to receive the second back-gate bias voltage PB_CSA,
   wherein the reference cell is configured to generate a main current, and
   wherein the unit cells are configured to mirror the main current.

2. The DAC system of claim 1 further comprising a multiplexer and a digital controller logic,
   wherein the digital controller logic is coupled to inputs of the BBGEN for controlling the BBGEN to generate back-gate bias voltages,
   wherein the multiplexer is configured to receive the generated back-gate bias voltages, and
   wherein the multiplexer is configured to be operated by the digital controller logic to select one of the generated back-gate bias voltages to be the first back-gate bias voltage PB_CSM and another one of the back-gate bias voltages to be the second back-gate bias voltage PB_CSA.

3. The DAC system of claim 1,
   wherein the reference cell comprises a first transistor and a second transistor that are serially-connected for generating the main current, and
   wherein the first transistor has a back-gate configured to receive the first back-gate bias voltage PB_CSM.

4. The DAC system of claim 3,
   wherein the current source array comprises the unit cells, a first resistor, a second resistor, a first capacitor, and a second capacitor,
   wherein the unit cells are coupled to the first resistor and the first capacitor via a first output node,
   wherein the unit cells are coupled to the second resistor and the second capacitor via a second output node,
   wherein the first output node and the second output node are the DAC output, and
   wherein the DAC output is configured to be a differential signal.

5. The DAC system of claim 4, wherein each of the unit cells comprises:
   a third transistor;
   a fourth transistor; and
   a switch for connecting the respective unit cell to either the first output node or the second output node,
   wherein the third transistor and the fourth transistor are serially connected for generating a current to mirror the main current,
   wherein the third transistor has a back-gate configured to receive the second back-gate bias voltage PB_CSA,
   wherein a gate of the third transistor is coupled to a gate of the first transistor, and
   wherein a gate of the fourth transistor is coupled to a gate of the second transistor.

6. The DAC system of claim 1, wherein the N-bit DAC comprises: the reference cell, the current source array of unit cells, a bandgap circuit, a voltage-to-current ("V2I") circuit, registers, decoder, deglitch and level shifter, and a clock tree.

7. The DAC system of claim 6,
   wherein the bandgap circuit is coupled to an input of the V2I circuit for providing a band gap voltage to the V2I circuit,
   wherein the V2I circuit is coupled to a resistor and the reference cell for generating a current through the reference cell based on the bandgap voltage and a resistance of the resistor,
   wherein the reference cell is coupled to the current source array for generating a differential, analog output signal,
   wherein the registers are configured to store the digital input code, and
   wherein the registers, decoder, deglitch and level shifter, and the clock tree are coupled together to generate differential signals to operate switches of the unit cells.

8. An N-bit digital-to-analog converter ("DAC") for converting a digital input code to an analog signal, comprising:

a reference cell; and a current source array of unit cells for generating a DAC output, wherein a back gate of the reference cell is configured to receive a first back-gate bias voltage PB_CSM, wherein a back gate of each of the unit cells is configured to receive a second back-gate bias voltage PB_CSA, wherein the reference cell is configured to generate a main current; and comprises a first transistor and a second transistor that are serially-connected for generating the main current;

wherein the first transistor has a back-gate configured to receive the first back-gate bias voltage PB_CSM; and wherein the unit cells are configured to mirror the main current.

9. The N-bit DAC of claim 8, wherein the current source array comprises the unit cells, a first resistor, a second resistor, a first capacitor, and a second capacitor, wherein the unit cells are coupled to the first resistor and the first capacitor via a first output node, wherein the unit cells are coupled to the second resistor and the second capacitor via a second output node, wherein the first output node and the second output node are the DAC output, and wherein the DAC output is configured to be a differential signal.

10. The N-bit DAC of claim 9, wherein each of the unit cells comprises:

a third transistor;

a fourth transistor; and a switch for connecting the respective unit cell to either the first output node or the second output node, wherein the third transistor and the fourth transistor are serially connected for generating a current to mirror the main current, wherein the third transistor has a back-gate configured to receive the second back-gate bias voltage PB_CSA, wherein a gate of the third transistor is coupled to a gate of the first transistor, and wherein a gate of the fourth transistor is coupled to a gate of the second transistor.

11. The N-bit DAC of claim 8 further comprising: a bandgap circuit, a voltage-to-current ("V2I") circuit, registers, decoder, deglitch and level shifter, and a clock tree.

12. The N-bit DAC of claim 11, wherein the bandgap circuit is coupled to an input of the V2I circuit for providing a band gap voltage to the V2I circuit, wherein the V2I circuit is coupled to a resistor and the reference cell for generating a current through the reference cell based on the bandgap voltage and a resistance of the resistor, wherein the reference cell is coupled to the current source array for generating a differential, analog output signal, wherein the registers are configured to store the digital input code, and wherein the registers, decoder, deglitch and level shifter, and the clock tree are coupled together to generate differential signals to operate switches of the unit cells.

13. A method for operating a digital-to-analog converter ("DAC") system, comprising the steps of:

selecting a first back-gate bias voltage for biasing a back-gate of a reference cell of the DAC;

selecting a second back-gate bias voltage for biasing a back-gate of each of the unit cells of the DAC;

generating the first and second back-gate bias voltages to be applied to the reference cell and the unit cells;

operating the unit cells based on a digital input code; and generating a DAC output by accumulating the current from the unit cells, wherein the reference cell generates a main current and the unit cells form a current source array for mirroring the main current.

14. The method of claim 13 wherein if the DAC output is not within a predefined threshold to a desired output, adjusting the first generated back-gate bias voltage and performing the operating step and the generating the DAC output step using the adjusted, first generated back-gate bias voltage.

15. The method of claim 13 wherein if the DAC output is not within a predefined threshold to a desired output, adjusting the second generated back-gate bias voltage and performing the operating step and the generating the DAC output step using the adjusted, second generated back-gate bias voltage.

16. The method of claim 13 wherein if the DAC output is not within a predefined threshold to a desired output, adjusting the first and the second generated back-gate bias voltages and performing the operating step and the generating the DAC output step using the adjusted, first and second generated back-gate bias voltages.

17. The method of claim 13 wherein, before the first selecting step, comprising the steps of:

inputting trim bits to a digital controller logic;

generating a digital signal based on the inputted trim bits; and converting the generated digital signal to a plurality of analog, back-gate bias voltages.

18. The method of claim 17 wherein the first selected back-gate bias voltage and the second selected back-gate bias voltage are selected from the plurality of analog, back-gate bias voltages.

* * * * *